US009502566B2

(12) United States Patent
Fenouillet-Beranger et al.

(10) Patent No.: US 9,502,566 B2
(45) Date of Patent: Nov. 22, 2016

(54) METHOD FOR PRODUCING A FIELD EFFECT TRANSISTOR INCLUDING FORMING A GATE AFTER FORMING THE SOURCE AND DRAIN

(71) Applicant: COMMISSARIAT A L'ENERGIE ATOMIQUE ET AUX ENE ALT, Paris (FR)

(72) Inventors: Claire Fenouillet-Beranger, Voiron (FR); Perrine Batude, Dijon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/493,651

(22) Filed: Sep. 23, 2014

(65) Prior Publication Data

US 2015/0084095 A1    Mar. 26, 2015

(30) Foreign Application Priority Data

Sep. 23, 2013 (FR) .................................... 13 59101

(51) Int. Cl.
| | |
|---|---|
| *H01L 29/78* | (2006.01) |
| *H01L 29/16* | (2006.01) |
| *H01L 29/161* | (2006.01) |
| *H01L 29/165* | (2006.01) |
| *H01L 27/088* | (2006.01) |

(Continued)

(52) U.S. Cl.
CPC ..... *H01L 29/7849* (2013.01); *H01L 21/02532* (2013.01); *H01L 21/30604* (2013.01);
(Continued)

(58) Field of Classification Search
CPC .................... H01L 29/7849; H01L 29/66621; H01L 21/30604; H01L 21/02532; H01L 29/165; H01L 29/1604; H01L 29/161; H01L 27/088; H01L 29/16; H01L 29/6656

USPC ........................................... 257/192; 438/285
See application file for complete search history.

(56) References Cited

U.S. PATENT DOCUMENTS 4,265,934 A * 5/1981 Ladd, Jr. ........................ 438/180
4,670,763 A * 6/1987 Ovshinsky et al. ............. 257/57
(Continued)

FOREIGN PATENT DOCUMENTS

FR        2 880 190 A1    6/2006

OTHER PUBLICATIONS

French Preliminary Search Report issued Mar. 31, 2014 in French Application 13 59101, filed on Sep. 23, 2013 (with English Translation of Categories of Cited Documents and Written Opinion).

*Primary Examiner* — Marcos D Pizarro Crespo
*Assistant Examiner* — Sue Tang
(74) *Attorney, Agent, or Firm* — Oblon, McClelland, Maier & Neustadt, L.L.P.

(57) ABSTRACT

The invention concerns a method for producing a transistor. The gate of the transistor is produced after having produced source and drain electrodes of the transistor. From a substrate having a stack of layers comprising at least two surface layers with a first layer of a first semiconductor material intended to produce a conduction channel of the transistor, and a second layer of a second semiconductor material situated on the first layer and intended to at least partly produce the source and drain electrodes of the transistor, the formation of a mask defining a cavity of a gate pattern and the creation of lateral recesses at the periphery of the gate pattern in the second layer and under the mask by an isotropic etching of the second material, and in that it comprises a filling of the lateral recesses with a dielectric material so as to form gate spacers therein.

30 Claims, 10 Drawing Sheets

(51) Int. Cl.
*H01L 29/66* (2006.01)
*H01L 21/02* (2006.01)
*H01L 21/306* (2006.01)
*H01L 29/786* (2006.01)

(52) U.S. Cl.
CPC ............ *H01L27/088* (2013.01); *H01L 29/16* (2013.01); *H01L 29/161* (2013.01); *H01L 29/1604* (2013.01); *H01L 29/165* (2013.01); *H01L 29/6656* (2013.01); *H01L 29/66772* (2013.01); *H01L 29/78654* (2013.01)

(56) References Cited

U.S. PATENT DOCUMENTS

| | | | | |
|---|---|---|---|---|
| 5,296,728 | A * | 3/1994 | Nakagawa | H01L 21/28587 257/280 |
| 6,787,423 | B1 * | 9/2004 | Xiang | 438/296 |
| 2004/0180521 | A1 | 9/2004 | Joly | |
| 2006/0046366 | A1 * | 3/2006 | Orlowski et al. | 438/198 |
| 2013/0175579 | A1 * | 7/2013 | Cheng et al. | 257/192 |
| 2013/0175622 | A1 * | 7/2013 | Haran et al. | 257/347 |

\* cited by examiner

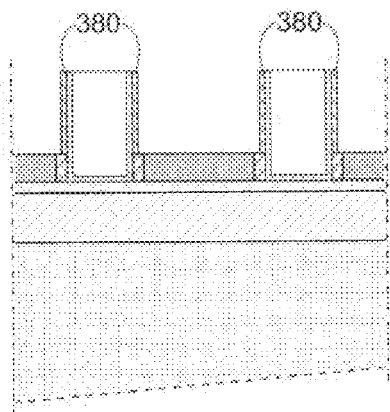
FIGURE 3g
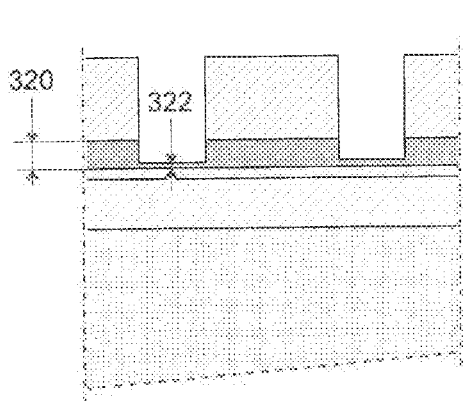 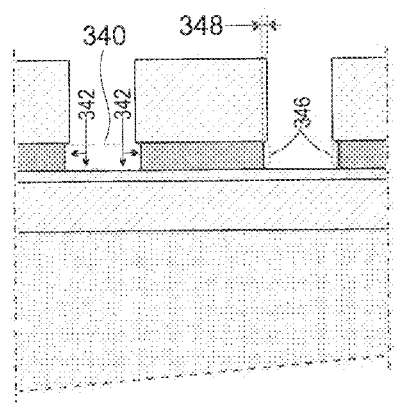
FIGURE 4a          FIGURE 4b

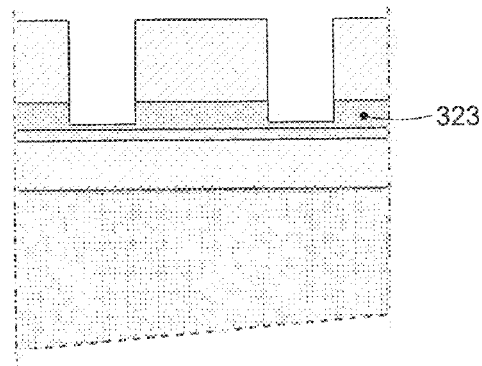
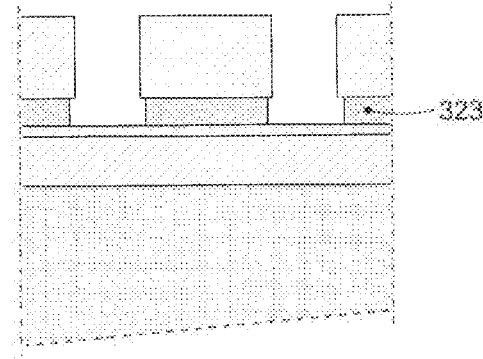
FIGURE 6a    FIGURE 6b
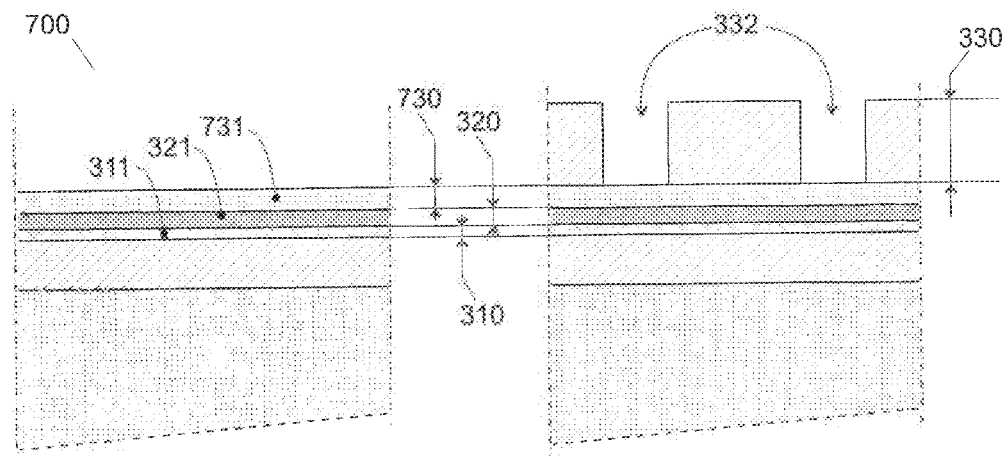
FIGURE 7a    FIGURE 7b

METHOD FOR PRODUCING A FIELD EFFECT TRANSISTOR INCLUDING FORMING A GATE AFTER FORMING THE SOURCE AND DRAIN

TECHNICAL FIELD OF THE INVENTION

The present invention concerns in general the production of transistors for integrated circuits and describes more particularly an improved method wherein the gate is produced last and which makes it possible to effectively control the critical dimensions or these transistors. It will find a preferential application for field effect transistors of the MOSFET type on a silicon on insulator substrate, with full depletion of their conduction channel (often referred to by the acronym FDSOI) with a cold integration method without a source/drain epitaxy step for example for sequential three-dimensional applications.

PRIOR ART

The ever increasing integration of a larger number of elementary components in integrated circuits produced by the microelectronics industry leads to having to continuously reduce their size. The so-called Moore's law, which means that a doubling of integration is observed every two years, continues to apply despite ever greater difficulties that must be dealt with for manufacturing components, the sizes of which are now measured in nanometers (where nm=$10^{-9}$ meters).

It is known that the typical basic component of a very large number of integrated circuits is a transistor with a metal-oxide-semiconductor or MOS structure, of the field effect type or FET, the acronym for "field effect transistor". In a MOSFET transistor a current is made to flow between a source electrode and a drain electrode under the control of a control gate that creates a conduction channel between source and drain as soon as a sufficient voltage is applied thereto.

FIG. 1 shows a view in cross section of a MOSFET transistor 100 characteristic of the prior art. It usual for the integrated circuits currently in production to be produced from elaborate substrates of the SOI type, the acronym for "silicon on insulator", and more generally "semiconductor on insulator". In FIG. 1 there is the original SOI substrate 110 that consists of an initial substrate 112, usually a homogeneous silicon wafer, and a buried oxide layer 114 that provides the insulation of the components that will be manufactured in the thin surface layer 116 of semiconductor present on the buried layer. The surface layer 116 usually consists of monocrystalline silicon but may consist of another semiconductor material.

It should be noted that the insulation of each of the transistors 100 is supplemented by the production of lateral isolation trenches known as STIs, the acronym for "shallow trench isolation". They reach as far as the buried oxide layer 114 and may extend beyond in order each to enclose transistors in a continuous layer of oxide. These trenches, which are not necessary to an understanding of the invention, are not depicted.

The MOSFET transistor structure shown schematically in FIG. 1 has been universally employed and has for many years made it possible for Moore's law to be effectively continued to be applied. This structure is in particular characterised firstly by the presence of spacers 130 between the source or drain (S/D) regions 140 and the gate region 120, and secondly by the production of so-called raised S/Ds that require epitaxial growth, for example of monocrystalline silicon 142 from the initial layer 116.

This structure has made it possible, despite the reductions in size that it was necessary to apply to the transistors in order to increase the integration density, to maintain or even improve their electrical characteristics by controlling in particular the series resistance 144 of access to the source and drain electrodes and the resistance under the spacer, which form, with the gate stray capacitance 135, a time constant that contributes to limiting the maximum switching speed of any transistor and which it is therefore necessary to minimise. The structure of FIG. 1 has made it possible to obtain this result. It should be noted that an important role fulfilled by the spacers is that they also electrically insulate the source and drain regions from the gate.

This structure is produced by means of a so-called "gate-first" technique in which, as the name suggests, first of all the gate electrode is produced in the form of a deposition of layers that will constitute the gate 120 of each transistor. The gate patterns are then defined by photolithography and etching of these layers. Each gate comprises two essential layers: the thin gate oxide 125 and the control gate 124 proper. The latter has for a long time been made from conductive polycrystalline silicon that fulfils the role of the metal in the MOS structure of the transistor.

Next the spacers 130 are produced on the sides of each gate pattern. The spacers, generally made from silicon nitride, and the gate itself, will serve to protect the channel 180 during the following formation of the source and drain (S/D) regions. The spacers and the S/D regions are therefore auto-aligned on the gate, which was defined first by photolithography. It should be noted that this constitutes a great advantage of the gate-first method that has enabled the microelectronics industry to achieve the largely submicron sizes of current transistors.

The formation of the S/Ds that follows comprises various steps including one or more operations of implanting dopants and also a localised epitaxy operation that increases the thickness of these regions for the purpose of reducing the access resistance to the channel for the reasons mentioned above. In this way raised S/D regions are obtained, generally designated by the acronym RSD, standing for "raised S/D", which has the same meaning.

The transistor structure of FIG. 1 and the gate-first operating mode have however proved to be insufficient for producing MOSFET transistors of decananometric size. The reduction in size of the transistors must be accompanied in fact by a simultaneous reduction in the thickness of the insulating layer 125 forming part of the gate in order to maintain the same electrical performances.

Traditionally made from silicon oxide ($SiO_2$), the required thickness has then become so small that excessively great gate leakage currents have appeared. In order to maintain the electrical performances of the transistors while maintaining low leakage currents, the microelectronics industry has had to have recourse, for the insulating layer 125, to materials with high permittivity. Referred to as "high-k", that is to say having a high dielectric coefficient compared with that of air, the use of these materials makes it possible in fact for the electrical performances of the transistors to be maintained without developing a significant gate leakage current. Such a material is for example hafnium oxide ($HfO_2$), which is however incompatible with the polycrystalline silicon used for the control gate 124. It has therefore also been necessary to replace it. A standard sandwich of layers currently used for the gates of transistors of decananometric size replaces the polycrystalline silicon with a metal layer. This type of technology is therefore referred to globally by the English term "high-k/metal-gate".

The consequences of replacing the materials forming the gate sandwich with a sandwich of layers of the "high-k/ metal-gate" type do not however stop there. In particular, the presence of metal in the sandwich of layers forming the gate makes the latter difficult to use as a protective mask for forming the S/D regions as required by the "gate-first" method briefly described above. The microelectronics industry has therefore turned simultaneously towards the use of a so-called "gate-last" method in which in fact the gate is produced after formation of the S/D regions in particular so that the latter does not have to suffer the high temperatures required by the "gate-first" method for forming these regions, as explained above.

The patent application FR-A-2 880 190 describes a "gate-last" method representative of this technique. As shown in FIG. 2 issuing from this application, the starting point remains identical, that is to say the transistors are produced there also from an elaborate substrate of the SOI type 110. The same layers as described above are found therein. In particular, as before, the transistor channel will be produced ultimately in the fine surface layer 116 made from a monocrystalline semiconductor material present on the surface of the Sal substrate. However, the major difference provided by the method described in this application, and in the "gate-last" methods in general, is that it is the S/D regions 240 that are produced first of all. In particular the thickening 242 of the monocrystalline layer 116 which is, as seen previously, necessary for reducing the access resistance to the drain and source electrodes, is produced well before the formation of the gate 220. Likewise, spacers 230 are found that are also produced before formation of the gate on the sides of a cavity that was etched in the various layers formed on top of the layer 116.

It should be noted here that the method described in FR-A-2 880 190 implies that the etching of the above cavity preferentially stops very exactly when it reaches the surface of the layer 116 in order to completely preserve the thickness thereof, a thickness that was defined very precisely during the operations of manufacturing the substrate (SOI). This constraint makes it possible to preserve, as in the "gate-first" technique, a highly advantageous functioning mode of the transistors, where the channel, very thin and with a perfectly controlled thickness, can effectively, under the action of the control gate, be completely depleted of carriers, that is to say "fully depleted" (FD), the English term that is generally used for designating this state. This type of transistor, which has many advantages in particular in terms of performance, is thus designated by the acronym FDSOI.

The method described in the patent application FR-A-2 880 190 does however come up against this difficulty in having recourse, in order to form the cavity that will receive the gate, to a so-called wet etching using a solution of tetramethyl ammonium hydroxide or TMAH, where it is difficult to control the depth of etching on very thin layers. Moreover, controlling the angle of the inclined sides 211 of the cavity is difficult. This directly affects another critical dimension (CD) of the transistors, which is the length 221 of the channel. These defects will cause a high dispersion of the electrical characteristics of the transistors produced with this method, which could be prejudicial to the correct functioning of the circuits using them.

One object of the invention is therefore to describe an improved method of the "gate-last" type that does not have, at least partly, the drawbacks mentioned above.

The other objects, characteristics and advantages for the present invention will emerge from an examination of the following description and the accompanying drawings. Naturally other advantages may be incorporated.

SUMMARY OF THE INVENTION

According to a first aspect, the invention relates to a method for producing a field effect transistor in which the gate of the transistor is produced after having produced source and drain electrodes of the transistor, comprising: from a substrate having a stack of layers comprising at least two surface layers with a first layer of a first semiconductor material, said first layer being configured to produce a conduction channel of the transistor, and a second layer, of a second semiconductor material different from the first semiconductor material, situated on the first, said second layer being configured to produce at least partly the source and drain electrodes of the transistor, the formation of a mask defining a cavity of a gate pattern and the formation of a cavity creating a gate pattern in the second layer, characterised in that it comprises the creation of lateral recesses at the periphery of the gate pattern in the second layer and under the mask by an isotropic etching of the second material, and in that it comprises a filling of the lateral recesses with a dielectric material, so as to form gate spacers therein.

Another aspect of the invention is a field effect transistor of the semiconductor on insulator type, having a stack of layers comprising:
  at least two surface layers with a first layer of a first semiconductor material, said first layer comprising a conduction channel of the transistor, and a second layer, of a second semiconductor material different from the first semiconductor material, situated on the first, said second layer comprising at least partly source and drain electrodes of the transistor,
  a gate formed at least partly in a cavity of a gate pattern in the second layer;
  gate spacers made from a dielectric material around the gate; characterised in that the gate spacers are at least partly formed by gate spacers situated in lateral recesses in the second layer, at the periphery of the gate, the lateral recesses being delimited by straight sides of the gate along the thickness of the second layer and by the first layer.

Another aspect of the invention is a microelectronic device comprising a plurality of transistors.

According to one aspect of the invention, a transistor and/or a microelectronic device obtained by the method of the invention is described.

BRIEF DESCRIPTION OF THE FIGURES

The aims, objects, features and advantages of the invention will emerge more clearly from the detailed description of embodiments thereof, illustrated by the accompanying drawings, according to which:
FIGS. 3a to 3g illustrate steps of the method of the "gate-last" method according to the invention.
FIGS. 4a and 4b illustrate a variant of the method of the invention in which the etching of the cavity configured to receive the gate is performed in two steps.

FIGS. 6a and 6b illustrate an option applicable to the variant of the method of FIGS. 5a to 5c, where the etching of the cavity configured to receive the gate is also effected in two steps.

FIGS. 7a to 7f also describe another version of the method of the invention in which the starting point is an elaborate substrate of the SOI type in which a third surface layer of a semiconductor material has been created.

Figure 1:
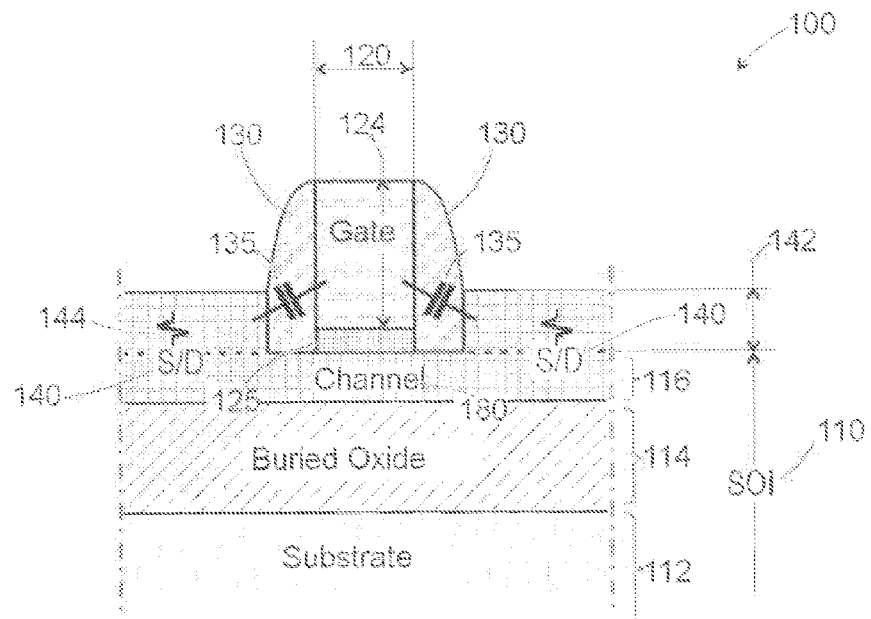
FIG. 1 illustrates a MOSFET transistor of the prior art produced by means of a "gate-first" method.
Figure 2:
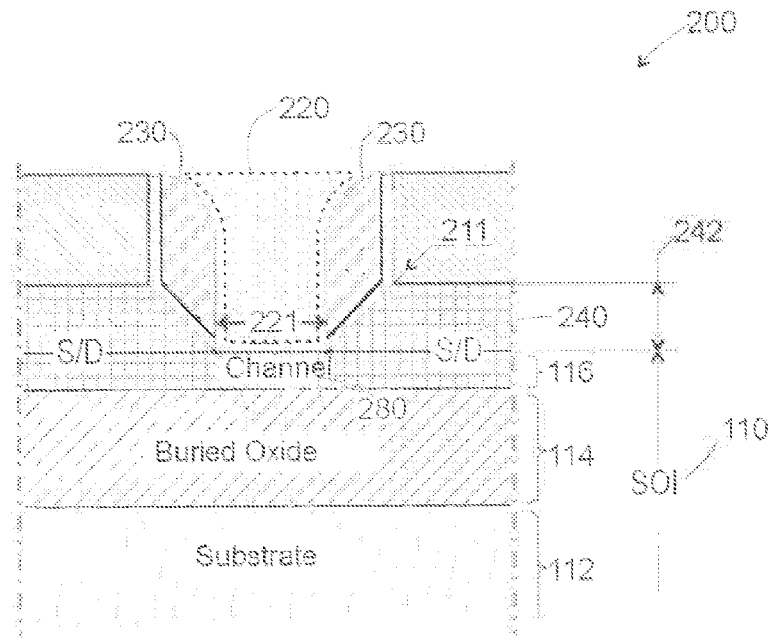
FIG. 2 illustrates a MOSFET transistor of the prior art produced by means of a "gate-last" method.

The accompanying drawings are given by way of examples and are not limitative of the invention.

DETAILED DESCRIPTION OF THE INVENTION

The following description is given for producing a field effect transistor, in particular of the MOSFET type. It can be extended to the simultaneous manufacture, on the substrate, of several transistors sharing in particular the same semiconductor layer in order to form their channels.

In the context of the present invention, terms such as "on" or "above" do not necessarily signify "in contact with". Thus, for example, the presence of a mask on a layer does not necessarily mean that they are in contact. This also does not mean that the element situated above the other covers it completely.

The term "thickness" means, unless otherwise stated, a dimension along the thickness of the substrate, for example perpendicular to a plane of a surface of the substrate. Likewise, the word "width" means, unless otherwise stated, a dimension perpendicular to the thickness of the substrate.

The invention relates to microelectronic devices. Microelectronic means in particular all microelectronic and nanoelectronic technologies. The devices that can be formed may form part of systems of the micro-electromechanical system type, referred to as MEMS, and/or with optical functions.

Before going into the detail of embodiments of the invention, in particular with reference to the drawings, options that the invention may have are stated below, individually or in any combination:

the duration of the isotropic etching of the second material is adjusted so as to achieve a predetermined width of the lateral recesses;

silicon is used as the first material;

silicon germanium SiGe is used as the second material;

silicon germanium SiGe is used as the first material, the germanium content of the second material being greater than the germanium content of the first material;

amorphous silicon is used as the second material;

the second layer of amorphous silicon is deposited on the first layer (it may also not be deposited if the starting material is silicon and the layer is amorphised by implantation);

the lateral recesses are created when the cavity is formed;

the lateral recesses are filled before the gate is formed;

the filling of the lateral recesses comprises a deposition of the dielectric material in the cavity and an etching of said material in order to leave in place thereof only the lateral recesses;

the formation of the cavity in the second layer comprises, before the isotropic etching, an anisotropic etching of the second material;

the anisotropic etching is configured so as to preserve a non-zero thickness of the second layer at the gate pattern;

use is made of a substrate having a stack of layers further comprising a third layer made from a third material different from the second material, situated on the second layer, and the mask is formed on top of the third layer so as to define the gate pattern cavity both in the thickness of the second layer and in the thickness of the third layer, and, after the formation of the mask and before the creation of the gate pattern in the second layer, etching is carried out of a gate pattern in the third layer comprising an isotropic etching of the third material forming a cavity selectively relative to the second layer and configured so as to create additional lateral recesses in the third layer, at the periphery of the gate pattern in the third layer and under the mask, and the additional lateral recesses are filled with a dielectric material, so as to form therein additional gate spacers;

the filling of the additional lateral recesses comprises a deposition of the dielectric material in the cavity and an etching of said material in order to leave it in place only in the additional lateral recesses;

the duration of the isotropic etching of the third material is adjusted so as to reach a predetermined width of the additional lateral recesses;

the etching of the gate pattern in the third layer comprises, before the isotropic etching in the third layer, an anisotropic etching of the third material;

the anisotropic etching of the third material is configured so as to preserve a non-zero thickness of the third layer at the gate pattern in the third layer;

the additional spacers are optionally formed wider than the spacers;

different materials are used for the spacers and additional spacers;

silicon germanium is used as the third material, the content of germanium in the third material being greater than the content of germanium in the second material;

a sandwich of layers forming the gate in the gate pattern is formed and then the mask is removed;

after the mask is removed, supplementary spacers are formed in contact with a free side part of the gate;

after the formation of the cavity, sacrificial spacers are formed by creating a layer of sacrificial material on the wall of the side of the cavity, the gate is formed, sacrificial material is removed so as to form an intermediate space in place of the sacrificial spacers, and the intermediate space is filled with a dielectric material that fills the lateral recesses;

the lateral recesses are created between the removal step and the step of filling the intermediate space;

the lateral recesses are created when the cavity is formed;

the method comprises a doping of the first layer through the intermediate space between the removal step and the intermediate filling step;

it also comprises a removal of the mask after the step of filling the intermediate space and doping of the second layer;

a substrate of the semiconductor on insulator type is used, the method being configured so as to produce at least one MOSFET transistor with full depletion of its conduction channel;

the stack of layers comprises a third layer made from a third material different from the second material, situated on the second layer, and comprising additional spacers situated in additional lateral recesses in the third layer, at the periphery of the gate, the additional lateral recesses being delimited by straight sides of the gate along the thickness of the third layer and through the second layer.

FIGS. 3a to 3g illustrate the steps of the method of the invention during which MOSFET transistors will be produced with spacers of controlled size and channels of controlled thickness over the entire surface of a substrate.

Figure 3A:
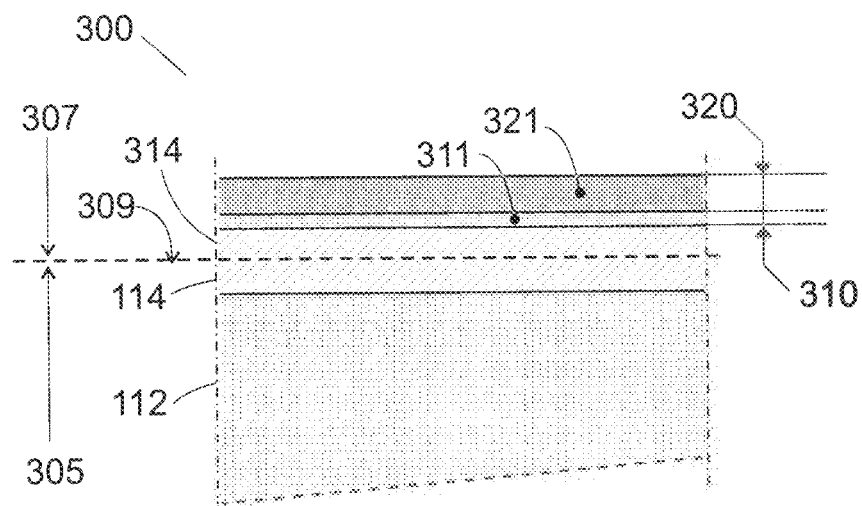

FIG. 3a illustrates the starting point of the method of the invention that uses an elaborate substrate of the SOI type like those that can be produced currently by the microelectronics industry.

The elaborate substrate used by the invention comprises two surface layers of semiconductor materials of different natures. A first layer 310 of a first semiconductor material 311 is preferentially created during the manufacture of the elaborate substrate 300 on the surface of the layer of oxide 114, already described previously, referred to as a buried layer or BOX, the acronym for "buried oxide", which has the same meaning. As also seen, the whole rests on a homogeneous substrate 112, generally made from silicon, configured to provide mechanical rigidity for the whole. It constitutes the body of the elaborate substrate and is often designated by the English term "bulk", which has a similar meaning.

A second layer 320 made from a second semiconductor material 321, different from the first, is next created when the elaborate substrate 300 is produced.

It should be noted here that the invention described below can be implemented otherwise than using a standard SOI substrate without restriction. FIG. 3a is only a simple example configured to illustrate the invention. In particular, the layers 310 and 320 necessary for implementing the invention may have been transferred to the surface of another device which was previously manufactured in order to constitute a three-dimensional (3D) stack of chips, more generally for manufacturing very dense microdevices combining possibly optical, mechanical and electronic.

In this case, the stack of lower functional layers 305 and the stack of upper layers 307 may typically be assembled by molecular bonding at their interface 309 at the time of transfer. The stacks of layers thus assembled may then each comprise an external layer of oxide, for example silicon oxide ($SiO_2$) generally used for the buried layer 114. The upper stack 307 will therefore comprise a similar layer 314.

For implementing the method of the invention, the first semiconductor material 311 will preferentially be made from silicon (Si), germanium (Ge) or an alloy of these two materials. Hereinafter referred to as SiGe, silicon and germanium are combined in various proportions indicated by a percentage reflecting the proportion of germanium in the alloy. For example the term SiGe 20% indicates an alloy containing a proportion of 20% of germanium atoms. All the other known semiconductor materials, homogeneous or composite, are also capable of being used.

The first layer of semiconductor material will, as will be seen below, serve to form the channel of the transistors, which will generally be of the FDSOI type as described in the part on the prior art. The thickness of this layer will for example typically be between 3 and 10 nm.

The second semiconductor material 321 can be chosen from the same list of materials as those possibly constituting the first material 311. The only constraint is, as seen, that the two materials should be different, so as to allow a selectivity of etching between the two layers 310, 320. The second layer 320 is advantageously thicker and is typically between 10 and 17 nm. The second layer essentially serves for thickening the S/D regions, as discussed in the part on the prior art, in order to improve the access resistances to these electrodes. This layer may be the subject of doping, in particular in situ, by implantation or diffusing. It is possible to dope either the whole of the thickness of the second layer or only a surface part. In the first case, it will preferentially be sought to avoid doping of the first layer, at the transistor channel (it is possible for example for this purpose to carry out the doping after masking of the region of the first and second layers in line with the channel region). It is also possible to produce, as described subsequently in more detail, sacrificial parts then etched. Next the source/drain are implanted and then the hard mask is deposited, otherwise referred to as the definition mask. Planing is carried out to the top of the gate. The gate is emptied and this gives a cavity and it is possible to perform steps similar to those described in the embodiment without a sacrificial gate.

The layer may also be doped in situ as from the start but this variant of the invention is less favourable since there is a risk of having diffusion in the channel.

Figure 3B:
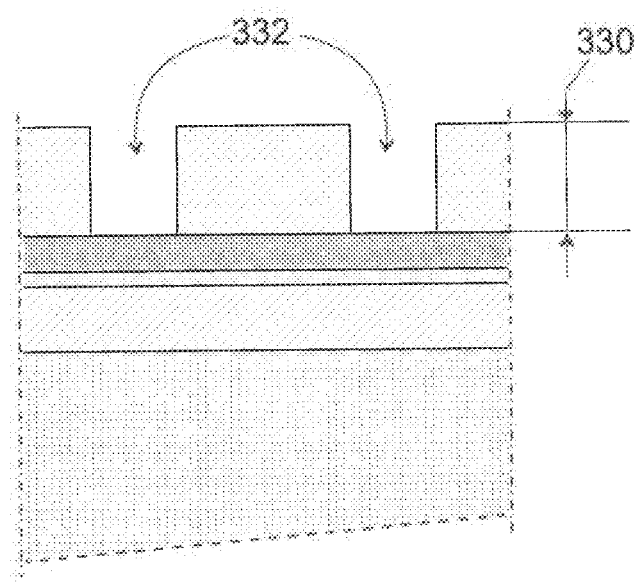

FIG. 3b shows the deposition of a "hard mask", often referred to by its acronym HM, in the form, in this example, of a layer 330 of silicon oxide ($SiO_2$). Openings 332 are formed therein in a conventional fashion by photolithography and then etching of the hard mask 330. These operations define the gate patterns of the MOSFET transistors.

Figure 3C:
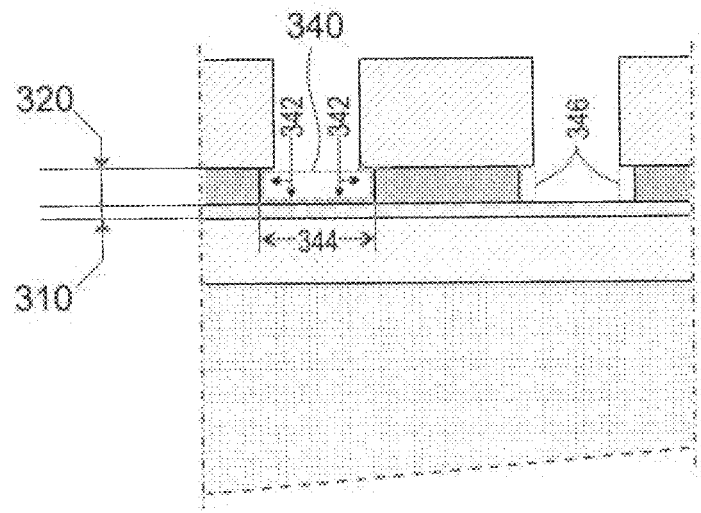

FIG. 3c shows the result of the etching in the second layer 320 of the cavities 340 configured to contain the gates that will then be formed therein as is the case in a "gate-last" method.

The etching 342 used for this operation is of the isotropic type; it is preferably carried out in an acidic solution, for example based on hydrochloric acid (HCl). The etching is done in all directions and in particular laterally over the entire periphery of the patterns defined in the hard mask 330. Because of this, the representations given by the drawings must be understood as being schematic as to the form of the etched sides, depicted by straight segments. This is because the chemical etching will produce rather curvilinear etching limit profiles, and in particular in an arc of a circle.

Advantageously, the cavity 340 is defined as being the whole of the space etched by the etching 342 of the layer 321.

Advantageously, the cavity 340 comprises lateral recesses 346 corresponding to the parts of the cavity 340 situated under the layer 330.

Advantageously, the lateral recesses 346 correspond to the empty space situated under the layer 330.

Advantageously, the cavity 340 comprises a middle part corresponding to the part of the cavity not situated under the layer 330. The median of the cavity 340 therefore corresponds to the etched space of the layer 321 situated in line with the opening 332.

In the example in FIG. 3c, the materials used are, with respect to the first layer 310 and the second layer 320 respectively, SiGe 20% and SiGe 40%. The selectivity of etching of the solution used (HCl), that is to say the etching differential between SiGe alloys containing a different proportion of germanium, is very great. For example, for the same etching solution and an identical time, an etching of 760 nm in SiGe 40%, an etching of 270 nm in SiGe 30% and no appreciable etching in SiGe 20% has been found experimentally. The first layer 310 made from SiGe 20% therefore in practice constitutes a stop layer of the etching in the sandwich of layers 310 and 320. The etching is in general considered to be selective if it attacks one material without significantly attacking another material.

The layer 310, which will constitute the channel of the MOSFET transistors, is thus preserved, preferentially completely. The thickness of the channel of the transistors will therefore then correspond strictly to the thickness of the first layer of semiconductor material that was created when the starting SOI substrate 300 was manufactured. This thickness is very well controlled, which causes little or no dispersion of the electrical parameters due to this critical dimension (CD), on which the correct functioning of the transistors is dependent.

It should be noted that under these conditions it is possible to carry out a lateral over-etching of the cavity, which makes it possible best to adjust its width 344 by creating more or less large lateral recesses 346 under the hard mask. These therefore have a width (that is to say a dimension perpendicular to a dimension of the substrate in thickness) to a value at least equal to the thickness of the layer 320.

Figure 3D:
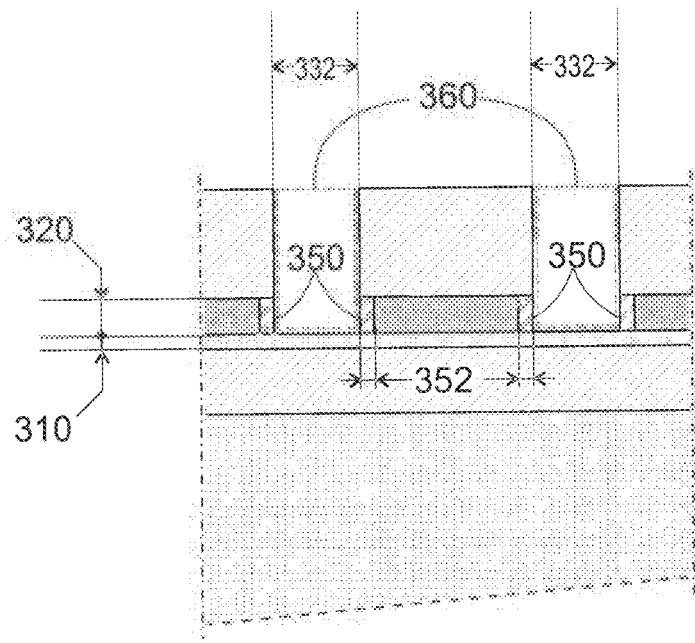

FIG. 3d illustrates the step of the method where the lateral recesses 346 created in the layer 320 by the previous etching are filled in. These will constitute at least partly the spacers of the transistors, the role of which was described previously.

To do this, it is possible to proceed with a conventional deposition of a dielectric material such as silicon nitride ($Si_3N_4$) or to deposit another insulating material with no permittivity, generally referred to by the English term "low-k" that is to say having a low dielectric coefficient (compared with the permittivity of air or vacuum). The use of such a material promotes the obtaining of low stray capacitances between the S/D regions and the gate, which helps to improve the performances of the transistor, as seen in the part on the prior art. The deposition of nitride is preferably done over a thickness that is at least equal to half the size of the cavity in order to ensure that the lateral cavities are completely filled. An anisotropic dry etching is next carried out.

This dry etching of the deposited material, nitride or "low-k" material, leaves in place stopper spacers 350 that completely fill the lateral recesses. Their width 352 is typically between 2 and 10 nm.

The filling of the lateral recesses in order to produce the spacers preserves the middle part of the cavities 340, as shown in FIG. 3c, which were etched in the second layer 320, that is to say the parts opposite the openings 332 formed in the hard mask.

Advantageously, the spacers are at least partly formed in the lateral recesses 346 without its material issuing from the formation of a dielectric layer continuing in at least one portion of the middle part of the cavity 340 in contact with the first layer 310. At least a portion of the middle part is therefore not filled with the dielectric material of the spacers.

These middle parts that have remained free then form, with the openings 332 in the hard mask, trenches 360 that it will be possible to fill in particular with a sandwich of layers chosen, for example a sandwich of the "high-k/metal-gate" type, configured to form the gates of the transistors. Advantageously, the trenches 360 are defined as being the empty space of the layer 330 comprising the middle part of the cavity 340 and the opening 332.

Figure 3E:
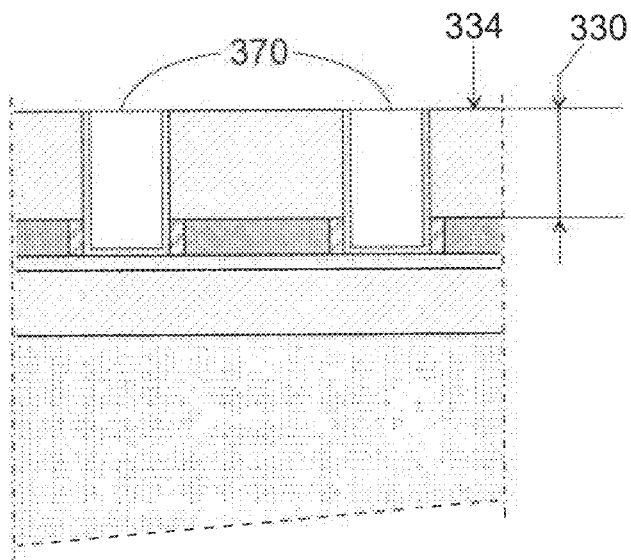

FIG. 3e shows the result of the step of the method where the trenches 360 are filled, defined by the sides of the hard mask and the middle part of the cavities, with the sandwich of layers constituting the gate 370 of the transistors. The corresponding deposits of materials can be done at low temperature. The operations that follow do not impair the properties of the deposited layers. The depositions of the gate layers are preferably done over the entire surface of the substrates until they completely fill in all the trenches 360. An operation of removal of material such as the standard one of chemical mechanical polishing is then performed, which leaves a flat surface 334 and the trenches filled in with the sandwich of layers forming the gates. It should be noted here that the methods of the "gate-last" type like the one of the invention thus manage to obtain, like the "gate-first" methods, an auto-alignment of the source and drain electrodes with those of the gate.

Advantageously, the gate pattern comprises the trenches 360 in order to form the gates 370 by filling in said trenches 360 with the sandwich of layers constituting the gate 370 of the transistors.

Figure 3F:
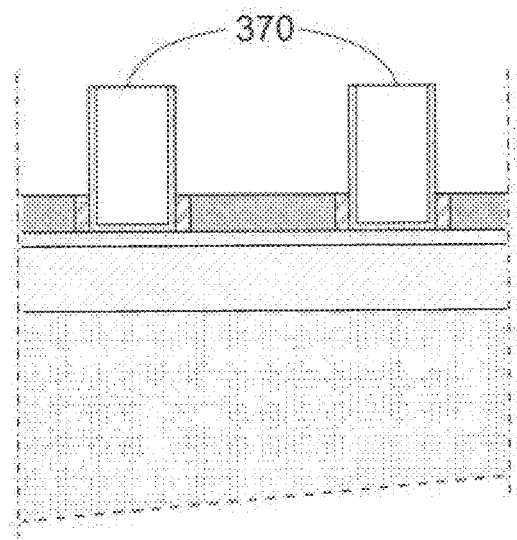

FIG. 3f shows the structure of the transistors after removal of the layer 330 which served as a hard mask for producing the gates 370. Removal of the hard mask makes it possible, optionally, to proceed with the doping of the source and drain regions, situated on either side of the gates 370, if this was not done before as explained in FIG. 3a. Removal of the hard mask very advantageously makes it possible also to proceed with the silicidation of the source and drain (S/D) regions in order to obtain very good electrical contact thereon.

FIG. 3g shows the production of supplementary spacers 380 on the sides of the gates after removal of the hard mask as explained in the previous figure. These spacers can be produced conventionally, for example by proceeding first of all with a "solid sheet" deposition of silicon nitride (SiN) and then performing the usual steps of a standard CMOS method until contacts are opened in the S/D regions and on the gates. It should be noted that the spacers 380 can be produced from a material different from that of the first spacers 350. The production of the spacers 380, and the following operations, can advantageously benefit from all the improvements that have been made in the methods for implementing the steps. In particular the use of so-called "stressed" materials, that is to say materials where it is arranged so that their crystalline lattices are slightly stressed, can be envisaged in order to improve the performances of the transistors produced in accordance with the method of the invention.

FIGS. 3a to 3g describe steps of the method of the invention that make it possible, in a method of the "gate-last" type, to create gate spacers of controlled size without any drawback for the underlying semiconductor layer configured to form the channel of the transistors and, in particular, without alteration to its thickness.

The result presented in FIG. 3g shows that the spacers 350 precisely delimited on the one hand by the first layer 310 and on the other hand by the side of the gate (that is to say a wall along the thickness of the second layer 320, an advantageously straight wall, that is to say parallel to the thickness of the second layer), and finally, by the remaining material of the second layer 320. These spacers 350 advantageously have the same height as the second layer 320 and therefore fit effectively as an intermediate insulator.

FIGS. 4a and 4b illustrate a variant of the method of the invention in which the etching of the cavity 340, in the second semiconductor 320, is performed in two steps.

As shown in FIG. 4a, a first anisotropic etching of the layer 320 is first of all carried out, which preserves a residual thickness 322, advantageously non-zero, of this layer without attacking the sides of the cavity.

As shown in FIG. 4b, a selective isotropic etching 342 of the remaining layer is then carried out as described for the first embodiment, for example with reference to FIG. 3c.

The advantage of an etching of the cavity 340 in two steps is that it is then possible to produce recesses 346 having a width 348 less than the thickness of the layer 320. The width 348 thus has a minimum value corresponding to the thickness 322 and a maximum width corresponding to the thickness of the layer 320.

Figure 5A:
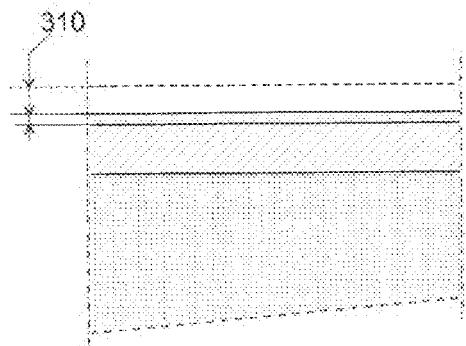
FIGS. 5a to 5c illustrate another variant of the invention in which the second semiconductor layer necessary to the implementation of the invention is not produced initially in the starting SOI substrate.
Figure 5B:
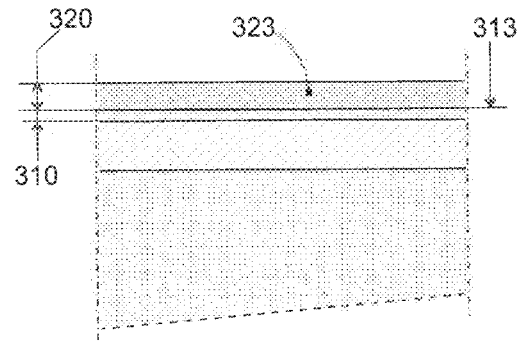
Figure 5C:
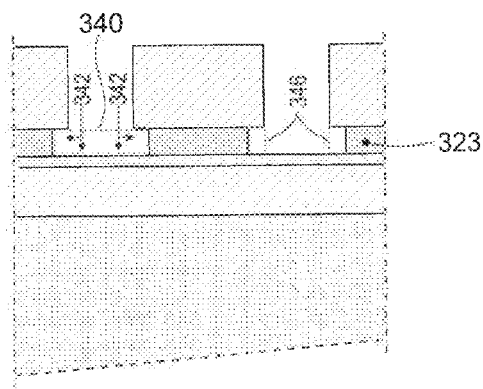

FIGS. 5a to 5c illustrate another variant of the invention in which the second layer 320 is not produced initially in the SOI substrate or 3D structure 300 from which the method of the invention applies. Only the first layer 310 of semiconductor material is present as shown in FIG. 5a. This has a more or less great thickness, typically in a range from 5 to 50 nm and is preferentially made from monocrystalline silicon.

In this variant of the invention the second layer 320 is advantageously made from amorphous silicon 323 as shown in FIG. 5b. This may be doped in order to increase its final conductivity as explained below. The use of amorphous silicon for the second layer is also possible in embodiments other than that of FIGS. 5a to 5c.

The layer 320 of amorphous silicon 323 may be produced by at least one or other of the following two methods.

Starting from a layer 310 the initial thickness of which is the sum of the required thicknesses for each of these layers, an amorphisation is carried out by ion implantation from the surface of this layer until a layer of amorphous silicon with the required thickness is obtained, thus forming the second layer 320 from the first. In order to reduce the roughness of the interface 313 between the amorphous silicon and the crystalline silicon of the layer 310, preferably implantation is carried out at low temperature, for example at a temperature below −100° C. The amorphised thickness is typically in a range from 5 to 50 nm. It always leaves in place a non-amorphised thickness, that is to say crystalline, corresponding to the thickness of the shell. In this approach the amorphisation of the layer 320 is advantageously done with an implantation of germanium (Ge) followed by an implantation of a dopant such as boron (B) for producing a p-channel transistor, or arsenic (As) or phosphorus (P) for an n-channel transistor. At this stage the conductivity is very poor since the silicon is amorphous. After producing spacers according to the invention and removing the hard mask made from oxide, it is then possible to carry out an annealing of the SPER type, the acronym for "solid phase epitaxy regrowth", which recrystallises the amorphous layer while activating the dopants, thus making this layer conductive.

The other method consists from a first layer 310 the thickness of which was chosen to correspond, as before, to the final thickness of the channel of the transistors. In this case the thickness is advantageously chosen in a range from 5 to 10 nm. A deposition of amorphous silicon 323 on the layer 310 is then carried out in order to form the layer 320. This deposition is of the PVD type, the acronym for "physical vapour deposition", or CVD, the acronym for "chemical vapour deposition".

As shown in FIG. 5c, and already described previously in FIG. 3c, it will be possible to create therein a cavity 340 by selective etching of the amorphous silicon 323 in this case. In a similar manner to the SiGe alloys containing various proportions of germanium, amorphous silicon is etched much more quickly than crystalline silicon, which constitutes in practice a stop layer for a dry etching. There is therefore obtained, as before, lateral recesses 346 of controlled size in order to produce the gate spacers therein.

The advantage of this variant of the method of the invention is that it makes it possible to produce thick S/D regions of silicon as in the standard methods and simultaneously makes it possible to produce CMOS transistors on the same level if the starting channel is made from silicon.

FIGS. 6a and 6b are similar to those of FIGS. 4a and 4b. They describe an etching of the cavities in two steps. The only difference is the material constituting the layer 320, which is amorphous silicon in this case. The same remarks and comments apply.

Figure 7C:
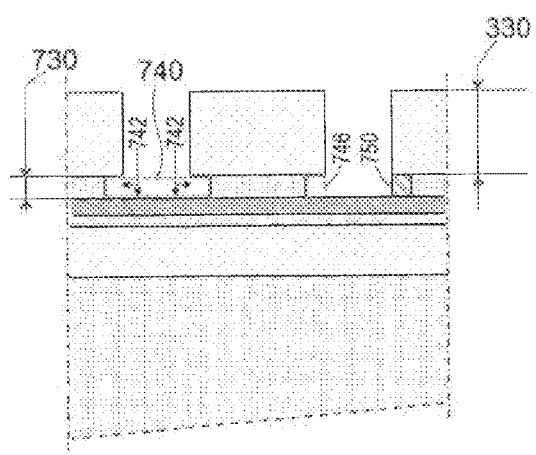

FIGS. 7a to 7f also describe another version of the method of the invention in which the starting point is an elaborate substrate of the SOI type in which there is created, as shown in FIG. 7a, a third surface layer 730 of a semiconductor material 731 again different from the materials 311 and 321 used respectively for the first 310 and second layer 320. As before, the above layers may have been transferred to the surface of a three-dimensional (3D) device in the course of manufacture. The material 731 of the third layer belongs for example to the list of materials already defined for the first and second layers.

For example, the layer 730, in particular with a typical thickness of 10 nm, may be made from SiGe 40%. The layer 320, with a thickness of 5 nm, can be made from SiGe 30%, and the layer 310, serving to produce the channel of the transistors, with an indicative thickness of 5 nm, can be made from silicon or SiGe 20%.

As described before in FIG. 3b, which is similar to FIG. 7b, the first step is to create openings 332 in a layer 330 forming a hard mask in order to define the patterns of the gate electrodes of the MOSFET transistors.

In a similar manner to what is described previously, as shown in FIG. 7c, a cavity 740 is first of all created in the third semiconductor layer 730 by selective etching 742 of this layer 730 from the openings in the hard mask. As before, the underlying layer made from a different semiconductor material, that is to say the second layer 320 in this case, serves as a stop for the etching. The third layer may be the subject subsequently of doping, for example as with the second layer 320.

FIG. 7c summarises the various steps, advantageously identical to those described in FIGS. 3c and 3d, which enable a first level or spacer to be formed in the third layer 730. As before, recesses 746 are therefore created, which are filled in with a dielectric material that may be specific to this layer in order to form a top level of spacers 750, the size of which can be freely adapted.

Figure 7D:
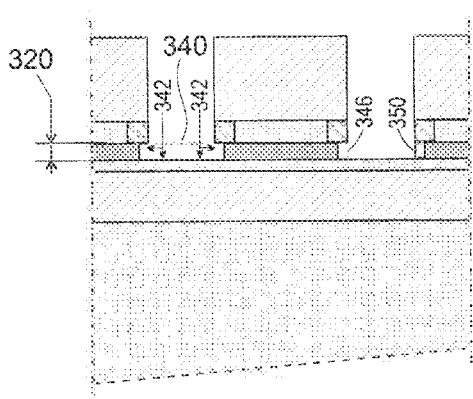

FIG. 7d summarises the steps already described in FIGS. 3c and 3d, which allow the formation of a second level of spacer this time, as before, in the second layer 320. Therefore, in this variant of the method, a second level of spacers 350 is obtained after selective etching 342 of the cavity 340 with the creation of recesses 346 that are filled in with a dielectric, possibly different from that of the layer situated above.

It should be noted that the size of the spacers and the dielectric employed may be adapted independently at each level, leaving great freedom for adapting the parameters of the transistors to the applications for which they are designed.

Figure 7E:
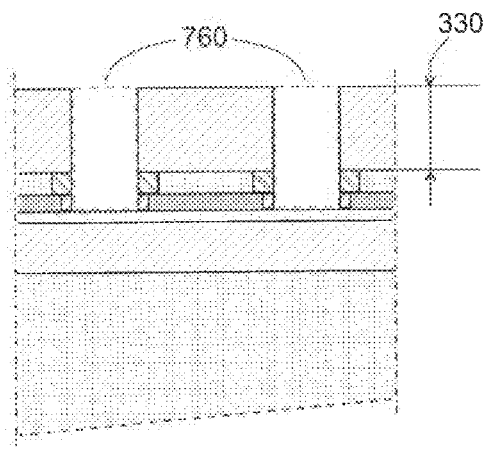

FIG. 7e illustrates the trenches 760 obtained at the end of the previous operations, which will be filled in in order to form the gate of the transistors as described in FIGS. 3d and 3e.

FIG. 3f shows the structure obtained after removal of the hard mask 330 at the end of the operations specific to the method of the invention, where the gate 370 of the transistors was obtained. The other standard steps that follow, in particular those producing the electrical interconnections between transistors, are not otherwise modified.

Figure 7F:
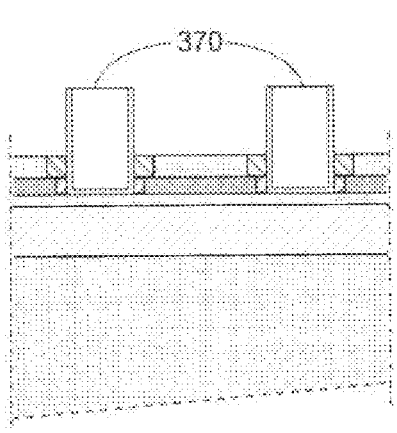

The result presented in FIG. 7f shows that the spacers 750 are precisely delimited firstly by the second layer 320 and secondly by the side of the gate (that is to say a wall along the thickness of the third layer 730, an advantageously straight wall, that is to say parallel to the thickness of the third layer), and finally, by the remaining material of the third layer 730. These spacers 750 advantageously have the same thickness as the third layer 730 and are in contact with the spacers 350. The spacers 750 are preferentially wider than the spacers 350 so as to splay, in the direction of the surface of the substrate, the global spacer thus formed.

FIGS. 8a to 8d describe another version of the method of the invention in which the spacers are produced last.

Figure 8A:
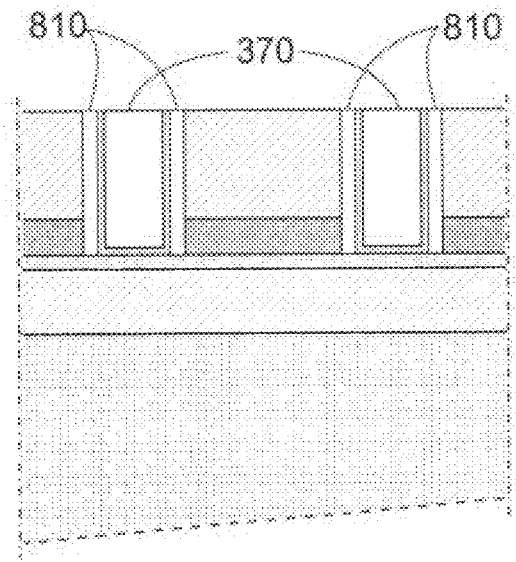
FIGS. 8a to 8d describe another version of the invention in which the spacers are produced last.

As shown in FIG. 8a, sacrificial spacers 810, for example made from silicon nitride (SiN), are first of all produced from the structure as described in FIG. 4a, having however etched the layer 320 over its entire thickness (as in FIG. 3b). These sacrificial spacers 810 may be produced by deposition (for example of a silicon nitride) and then removal, in particular by anisotropic etching, of the material deposited at the cavity bottom, so as to keep the sacrificial material in place only on the side wall of the cavity 340. The side wall extends from the wall of the cavity not comprising the cavity bottom part situated at the surface of the first layer 310. The side wall is therefore directed along the thickness of the layers.

It is then possible to proceed directly, as described previously, with the deposition of the sandwich of layers of the "high-k/metal-gate" type forming the gate 370 of the transistors.

Figure 8B:
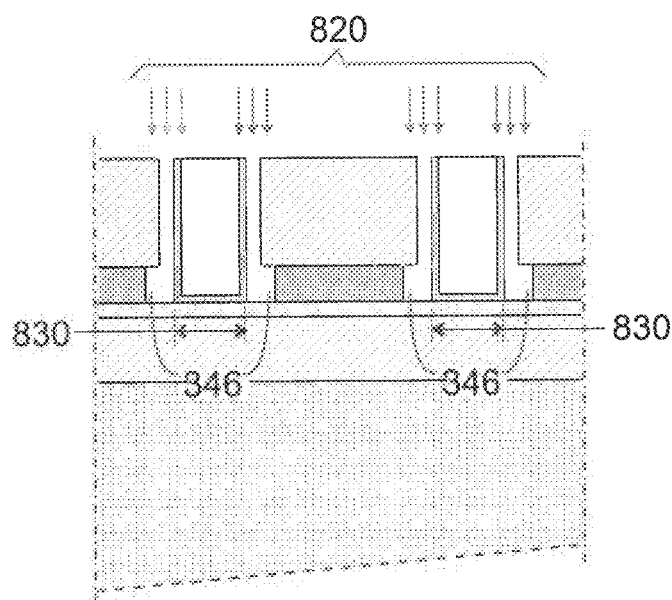

As shown in FIG. 8b, the sacrificial spacers are next removed, by selective etching (for example with wet etching using phosphoric acid in the case where the sacrificial spacers 810 are made from silicon nitride), and then the recesses 346 are formed in the layer 320 as before, by isotropic etching attacking the material of the second layer 320 laterally. If the material of the second layer 320 can be etched with the same solution as the material of the sacrificial spacers 810, the removal and formation of the spacers can be done in a single step. This material may be SiGe for example.

It should be noted that the gate is already formed during the creation of recesses 346 in this embodiment. The sacrificial spacers 810 will have made it possible to define an intermediate space, between the gate on the one hand and the side of the second layer 320 and mask on the other hand, so as to locate a doping.

In a non-illustrated variant of the invention, the lateral recesses 346 are formed at the start of the method as in the examples corresponding to FIGS. 3a to 7f, when the cavity 340 is formed. This makes it possible for example to perform a single isotropic etching step in order to hollow out both the cavity 340 and the recesses 346. After formation of the gate 370, all that has to be done is to remove the sacrificial spacers 810 and to carry out the filling with a dielectric material in order to create the gate spacers 350.

An implantation 820 can in fact then be carried out for the purpose of locally doping the semiconductor layer 310 that serves to produce the channel of the transistors. This operation very precisely defines the extension of the source and drain regions and consequently the length of the channel 830 of the transistors.

Figure 8C:
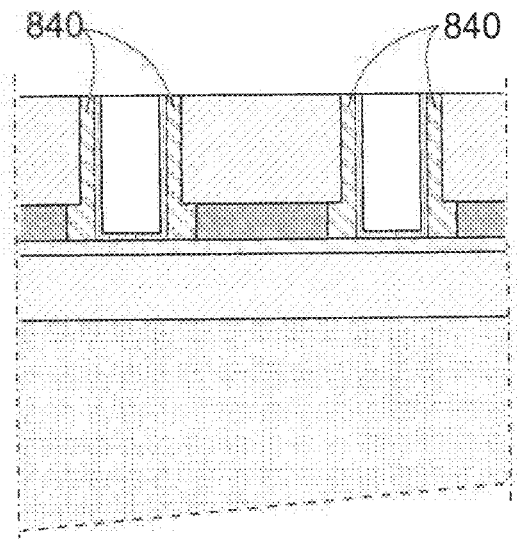

FIG. 8c illustrates the structure obtained after filling of the spacers 840 with the definitive material. It should be noted in this example that the spacers 840 comprise a part situated in the lateral recesses 346 and corresponding to the spacers 350, as well as a part extending in line with the first part, through the thickness of the mask. This second part has advantageously a lesser width than the first. The spacers 840 thus have a shape roughly in an L.

Figure 8D:
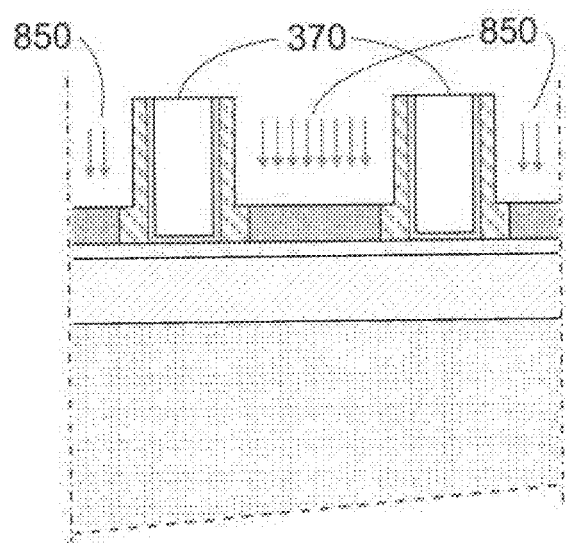

As shown in FIG. 8d, it is then possible, as before, to proceed with the removal of the hard mask, which will make it possible to dope by implantation 850 the source and drain regions situated on either side of the gates 370 and to proceed with siliciding thereof in order to reduce the access resistances to these electrodes.

The method of the invention and the variants described in the previous figures enable the thickness of the channel of the transistors to be well controlled over the entire surface of the substrate and for the dimensions of the spacers and filling thereof to be able to be adapted without any constraint other than the obtaining of the optimum performances for the transistors of a given application.

The invention claimed is:

1. A method for producing a field effect transistor, comprising producing a gate of the transistor after having produced source and drain electrodes of the transistor, comprising:
   from a substrate having a stack of layers comprising at least two surface layers with a first layer of a first semiconductor material, said first layer being configured to produce a conduction channel of the transistor, and a second layer, of a second semiconductor material different from the first semiconductor material, situated on the first layer, said second layer being configured to produce at least partly the source and drain electrodes of the transistor, forming a mask with an opening in said mask;
   forming a cavity creating a gate pattern in the second layer, through an isotropic etching of the second semiconductor material so that the cavity reaches a top surface of the first layer, the cavity comprising a middle part situated in line with the opening and lateral recesses at a periphery of the middle part in the second layer and under the mask; and
   forming gate spacers by depositing a dielectric material at least in the lateral recesses of the cavity, the gate being disposed in at least one portion of the middle part of the cavity in contact with the first layer.

2. The method according to claim 1, wherein a duration of the isotropic etching of the second semiconductor material is adjusted so as to achieve a predetermined width of the lateral recesses.

3. The method according to claim 1, wherein silicon is used as the first semiconductor material.

4. The method according to claim 1, wherein silicon germanium (SiGe) is used as the second semiconductor material.

5. The method according to claim 4, wherein silicon germanium (SiGe) is used as the first semiconductor material, a germanium content of the second semiconductor material being greater than a germanium content of the first semiconductor material.

6. The method according to claim 1, wherein amorphous silicon is used as the second semiconductor material.

7. The method according to claim 6, wherein the second layer of amorphous silicon is deposited on the first layer.

8. The method according to claim 1, wherein the lateral recesses are created when the cavity is formed.

9. The method according to claim 8, wherein the lateral recesses are filled before the gate is formed.

10. The method according to claim 9, wherein the filling of the lateral recesses comprises an etching of said deposited dielectric material in order to leave in place thereof only the filled lateral recesses.

11. The method according to claim 8, wherein the forming the cavity in the second layer further comprises, before the isotropic etching, an anisotropic etching of the second semiconductor material.

12. The method according to claim 11, wherein the anisotropic etching preserves a non-zero thickness of the second layer at the gate pattern.

13. The method according to claim 8,
wherein the substrate having the stack of layers further comprises a third layer made from a third material different from the second semiconductor material, disposed on the second layer, wherein the mask is formed on top of the third layer so as to define a gate pattern cavity both in the second layer and in the third layer, and
further comprising, after the formation of the mask and before the creation of the gate pattern in the second layer, etching a gate pattern in the third layer comprising an isotropic etching of the third material forming the cavity selectively relative to the second layer and configured to create additional lateral recesses in the third layer, at a periphery of the gate pattern in the third layer and under the mask, and
wherein the additional lateral recesses are filled with the dielectric material, so as to form therein additional gate spacers.

14. The method according to claim 13, wherein the filling of the additional lateral recesses comprises a deposition of the dielectric material in the cavity and an etching of said material in order to leave said material in place only in the additional lateral recesses.

15. The method according to claim 13, wherein the duration of the isotropic etching of the third material is adjusted to reach a predetermined width of the additional lateral recesses.

16. The method according to claim 13, wherein the etching of the gate pattern in the third layer further comprises, before the isotropic etching in the third layer, an anisotropic etching of the third material.

17. The method according to claim 16, wherein the anisotropic etching of the third material preserves a non-zero thickness of the third layer at the gate pattern in the third layer.

18. The method according to claim 13, wherein the additional gate spacers are formed wider than the gate spacers.

19. The method according to claim 13, wherein different materials are used for the gate spacers and the additional gate spacers.

20. The method according to claim 13,
wherein silicon germanium (SiGe) is used as the first semiconductor material, a germanium content of the second semiconductor material being greater than a germanium content of the first semiconductor material, and
wherein the silicon germanium (SiGe) is used as the third material, a content of germanium in the third material being greater than the content of germanium in the second semiconductor material.

21. The method according to claim 8, further comprising forming a sandwich of layers forming the gate in the gate pattern and then removing the mask.

22. The method according to claim 21, further comprising, after the removing the mask, forming supplementary spacers in contact with part of a free side of the gate.

23. The method according to claim 1, further comprising, after forming the cavity:
forming sacrificial spacers by creating a layer of a sacrificial material on a side wall of the cavity;
forming the gate;
removing the sacrificial material to form an intermediate space in place of the sacrificial spacers; and
filling the intermediate space with the dielectric material, said filling comprising filling the lateral recesses.

24. The method according to claim 23, wherein the lateral recesses are created between the removing the sacrificial material and the filling the intermediate space.

25. The method according to claim 23, wherein the creation of the lateral recesses is performed when the cavity is formed.

26. The method according to claim 23, further comprising a doping of the first layer through the intermediate space between the removing the sacrificial material and the filling the intermediate space.

27. The method according to claim 26, further comprising removing the mask after the filling the intermediate space and a doping of the second layer.

28. The method according to claim 1, wherein the substrate is of a semiconductor on insulator type, the method for producing the field effect transistor comprising producing at least one metal-oxide-semiconductor field-effect transistor (MOSFET) with full depletion of a conduction channel of the MOSFET.

29. The method according to claim 1, wherein the first layer is used as an etch stop layer for the isotropic etching.

30. The method according to claim 1, wherein the depositing the dielectric material further comprises filling the lateral recesses with the dielectric material.

* * * * *